United States Patent

Capasso et al.

[11] Patent Number: 5,936,989
[45] Date of Patent: *Aug. 10, 1999

[54] QUANTUM CASCADE LASER

[75] Inventors: Federico Capasso, Westfield; Alfred Yi Cho, Summit; Jerome Faist, Scotch Plains; Albert Lee Hutchinson, Piscataway, all of N.J.; Gaetano Scamarcio, Bari, Italy; Carlo Sirtori, Paris, France; Deborah Lee Sivco, Warren, N.J.

[73] Assignee: Lucent Technologies, Inc., Murray Hill, N.J.

[*] Notice: This patent is subject to a terminal disclaimer.

[21] Appl. No.: 08/841,059

[22] Filed: Apr. 29, 1997

[51] Int. Cl.$^6$ ................................................ H01S 3/19
[52] U.S. Cl. ................................................ 372/45
[58] Field of Search .................... 372/45, 43, 44, 372/46; 385/123

[56] References Cited

U.S. PATENT DOCUMENTS 5,457,709  10/1995  Capasso et al. ..................... 372/45
5,502,787  3/1996  Capasso et al. ..................... 385/123
5,509,025  4/1996  Capasso et al. ..................... 372/45
5,745,516  4/1998  Capasso et al. ..................... 372/45

OTHER PUBLICATIONS

Patent Application F. Capasso 43–74–7–11–8–12 mailed Mar. 27, 1997.

*Primary Examiner*—Rodney Bovernick
*Assistant Examiner*—Quyen Phan Leung
*Attorney, Agent, or Firm*—Eugen E. Pacher

[57] ABSTRACT

The core of the disclosed novel quantum cascade (QC) laser comprises a multiplicity of nominally identical repeat units, with a given repeat unit comprising a superlattice active region and a carrier injector region. Associated with the superlattice active region is an upper and a lower energy miniband, with the lasing transition being the transition from the lower edge of the upper miniband to the upper edge of the lower miniband. The injector facilitates carrier transport from the lower miniband to the upper miniband of the adjacent downstream repeat unit. QC lasers according to this invention can be designed to emit in the infrared, e.g., in the wavelength region 3–15 $\mu$m, and can have high power.

8 Claims, 3 Drawing Sheets

QUANTUM CASCADE LASER

FIELD OF THE INVENTION

This invention pertains to quantum cascade (QC) lasers, and to articles that comprise such lasers.

BACKGROUND

Recently a new type of semiconductor laser, designated "quantum cascade" or "QC" laser, was discovered. See, for instance, U.S. Pat. Nos. 5,457,709 and 5,509,025, and U.S. patent application Ser. No. 08/825,286, titled "Article Comprising An Electric Field-Tunable Semiconductor Laser", filed Mar. 27, 1997 by Capasso et al., all incorporated herein by reference. Furthermore, U.S. Pat. No. 5,745,516, filed Nov. 6, 1996 by the instant inventors, is closely related to the instant application.

Known QC lasers are unipolar semiconductor lasers that have a core region that comprises a multiplicity of essentially identical repeat units, each repeat unit comprising one or more quantum wells (QWs). Successive carrier transitions from a higher to a lower energy state result in photon emissions, with the photon energy depending on the structural and compositional details of the repeat units. Thus, QC lasers can be designed to emit radiation at substantially any desired wavelength in a rather wide spectral region. Specifically, they can be designed to emit in the mid-infrared (mid-IR), a spectral region for which there are few convenient radiation sources.

Although several types of QC lasers are known, it would clearly be desirable if further types were known, since this would give designers increased design freedom, and possibly provide improved characteristics. This application discloses a new type of QC laser.

GLOSSARY AND DEFINITIONS

A "quantum well" ("QW") herein is a (generally planar) semiconductor region of a first effective composition that is sandwiched between two semiconductor regions (barrier layers) of a second effective composition, generally selected to have a larger bandgap energy than the first effective composition. The spacing between the two barrier layers (and thus the thickness of the quantum well) is selected such that the relevant charge carriers (typically electrons) exhibit quantum effects in the direction normal to the QW. Typically the carrier energy is quantized in the direction normal to the QW, with the well exhibiting one or more discrete energy levels.

By "effective composition" we mean herein the average composition of a semiconductor region, exemplarily a superlattice region or a digitally graded alloy region. The effective composition is the thickness-weighted average of the barrier composition and QW composition. Such a region is frequently referred to as a "superlattice alloy", or "digital alloy".

By a "superlattice" we mean herein a (frequently periodic) multiplicity of QWs (exemplarily five or more), with a barrier layer between consecutive QWs, and with layer spacings such that the carrier energy states are not localized to individual QWs but instead extend throughout the superlattice region. A digital alloy is considered to be a superlattice, whereas a superlattice is not necessarily a digital alloy, depending on QC and barrier thicknesses.

A "miniband" herein is an energy region, generally associated with a superlattice, that contains a multiplicity of (typically relatively narrowly spaced), non-localized carrier energy states. Due to the presence of spatially extended energy states, minibands can provide efficient carrier transport. If there are two or more minibands associated with a given superlattice, then two adjacent minibands are separated by a minigap, i.e., an energy region devoid of carrier energy states. Thus, carrier transport through a minigap region is by tunneling and is generally very limited. For a given choice of QW and barrier materials, miniband and minigap widths can be engineered by suitable choice of layer thicknesses. Superlattices can be formed by known growth techniques, e.g., by MBE.

SUMMARY OF THE INVENTION

The invention is embodied in an article (e.g., an absorption measurement system) that comprises a novel QC laser. The laser comprises a first and a second cladding region and a core region between the cladding regions. The core region has higher effective refractive index than the cladding region, the combination thus forming an optical waveguide. The laser further comprises electrical contacts selected to facilitate flowing an electrical current through the laser.

The core region comprises a multiplicity of essentially identical (i.e., nominally identical, differing only due to, typically unavoidable, manufacturing variations) multilayer semiconductor repeat units. Each repeat unit comprises an active region and a carrier injector region. The active region has an upper and a lower energy state, with carrier (typically electron) transition from the upper to the lower energy state resulting in emission of a photon of wavelength $\lambda$, exemplarily in the range 3–15 $\mu$m.

Significantly, the active region of a given repeat unit comprises a strongly coupled superlattice region having an upper and a lower miniband, with a minigap between the upper and lower minibands. The upper energy state is in the upper miniband (typically at the lower edge thereof), and the lower energy state is in the lower miniband (typically at the upper edge thereof). Furthermore, the carrier injector region is selected to facilitate carrier transport from the lower miniband of the given repeat unit to the upper miniband of the adjacent (downstream) repeat unit. The carrier injector region preferably is a digitally graded alloy region but could be an analog graded alloy region.

In pictorial terms, in a QC laser according to the invention, an electron moves down an energy "staircase", emitting a photon of wavelength $\lambda$ every time it drops down a "step" from an upper to a lower miniband, and moving to the next "edge" by conduction through a carrier injector region.

DETAILED DESCRIPTION

Lasers according to this invention exhibit lasing transitions between minibands using unipolar injection. Thus, they use a novel lasing transition not suggested by the prior art.

Figure 1:
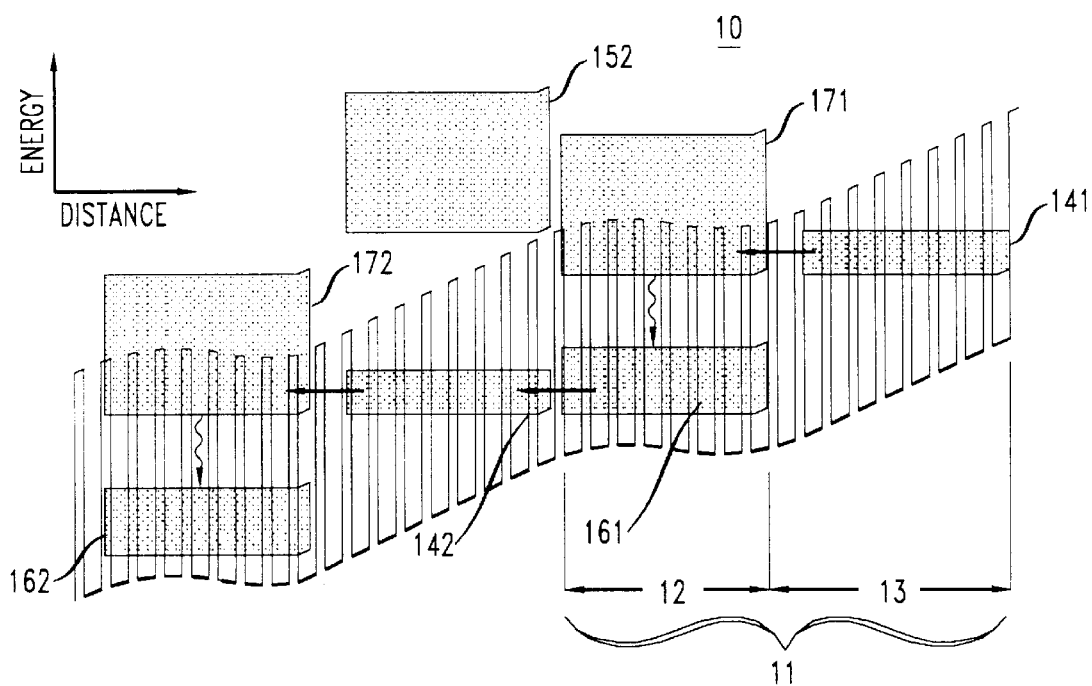
FIG. 1 shows a conduction band diagram of a portion of the core of an exemplary QC laser according to the invention.

FIG. 1 shows a calculated conduction band diagram of a portion (2 of, exemplarily, 25 repeat units) of the core region of a QC laser according to the invention. Electrons are injected by tunneling into the upper miniband of the n-doped superlattice active regions. Laser action (indicated by wavy arrows) occurs at the minigap between filled energy states at the bottom of the upper miniband and empty energy states at the top of the lower miniband. The digitally graded AlInGaAs injectors comprise short-period n-type doped AlInAs/GaInAs superlattices with varying duty cycles.

More specifically, FIG. 1 shows the conduction band edge of 2 repeat units, with distance normal to the layer structure of the laser being shown along the abscissa, and energy along the ordinate. Numeral 11 indicates one repeat unit, and numerals 12 and 13 respectively indicate the active region and the injector of the repeat unit. Numeral 141 indicates the lowest injector conduction band, and numerals 161 and 171 refer, respectively, to the lower and upper minibands of the active region of one repeat unit, and numerals 162 and 172 refer to the upper and lower minibands of the neighboring (downstream) repeat unit. Electron transport from lower miniband 161 to upper miniband 172 is through injector conduction band 142. Numeral 152 refers to the injector upper conduction band. It plays no significant role in laser action of the exemplary QC laser. The width of the minigap between the active region minibands is a design parameter that determines the lasing wavelength $\lambda$. In FIG. 1, straight arrows indicate electron transport in the downstream direction, and wavy arrows indicate the lasing transition.

TABLE I

| | DOPING n (cm$^{-3}$) | THICKNESS (nm) | |
|---|---|---|---|
| GaInAs | Sn 1.0 × 10$^{20}$ | 20.0 | Contact Layer |
| GaInAs | Si 8.0 × 10$^{18}$ | 600.0 | ↑ |
| AlGaInAs Graded | 5.0 × 10$^{17}$ | 40.0 | \| UPPER |
| AlInAs | 5.0 × 10$^{17}$ | 20.0 | WAVEGUIDE |
| AlInAs | 3.0 × 10$^{17}$ | 1200.0 | CLADDING |
| AlInAs | 1.2 × 10$^{17}$ | 1200.0 | \| |
| AlInAs | 1.0 × 10$^{18}$ | 10.0 | ↓ |
| AlGaInAs Graded | 1.0 × 10$^{17}$ | 40.0 | ↑ |
| GaInAs | 1.0 × 10$^{17}$ | 40.0 | \| |
| AlGaInAs Digitally graded | 1.0 × 10$^{17}$ | 42.5 ↑ x | WAVEGUIDE CORE |
| GaInAs/AlInAs Superlattice | 1.0 × 10$^{17}$ | 42.4 ↓ 25 | \| |
| GaInAs | 6.0 × 10$^{16}$ | 400.0 | \| |
| AlGaInAs Digitally graded | 1.0 × 10$^{17}$ | 25.0 | ↓ |
| Doped n$^+$InP substrate | | | Lower Waveguide Cladding |

Table I shows the layer structure of an exemplary QC laser according to the invention, designed for emission of ~8 $\mu$m IR radiation. The structure comprises 25 repeat units, each consisting of a digitally graded injector and an eight period superlattice with 1 nm thick Al$_{0.48}$In$_{0.52}$As barriers and 4.3 nm thick Ga$_{0.47}$In$_{0.53}$As QWs. As can be seen from Table I, the layer structure is n-doped. This is a significant difference from previously disclosed QC lasers, wherein at least part of the layer structure was undoped. In the instant laser the dopant was Si in all but the contact layer, where it was Sn.

The waveguide effective refractive index differences between the core and the respective claddings provide the optical confinement necessary for propagation of the radiation parallel to the layers. Our calculations show that the exemplary structure has a confinement factor $\Gamma$=0.32, and a core effective index $n_{eff}$=3.21. The lasing mode is polarized normal to the layers (TM mode) as required by the selection rule for interminiband transitions. The top cladding comprises a 2.4 $\mu$m thick AlInAs layer. This thickness is necessary because of the relatively long wavelength in the material. The heavily doped 600 nm thick GaInAs layer below the contact layer serves to achieve a high $\Gamma$ and to reduce waveguide losses by reducing coupling to the plasmon mode (that propagates along the semiconductor/metal contact interface) without growing a too thick AlInAs cladding layer. See U.S. Pat. No. 5,502,787. The lower cladding is the InP substrate. This choice of lower cladding substantially reduces the thermal impedance of the structure, compared to the use of AlInAs.

The choice of carrier concentration in the doped superlattice active regions is an important design consideration. The density must be large enough to minimize electric field penetration into the superlattice region and space charge build-up under high current injection (which could break up the minibands via field-induced localization). The carrier concentration must also be low enough for the quasi-Fermi level to be well below the top of the lower miniband to minimize thermal occupation of these states even at higher temperatures (e.g., room temperature or even higher). These design considerations resulted in the choice of n=1×10$^{17}$cm$^{-3}$ in the exemplary QC laser according to the invention.

Each 42.5 nm thick injector consists of a uniformly doped (n=1×10$^{17}$cm$^{-3}$) Al$_{0.48}$In$_{0.52}$As/Ga$_{0.42}$In$_{0.53}$As graded bandgap superlattice alloy with constant period (5.3 nm) and varying AlInAs/GaInAs thickness ratio. Under an appropriate voltage, the conduction band in the injector acquires a flat profile and electrons are transported through the injector into the superlattice. The onset of strong injection into the downstream upper active region miniband occurs when the bottom of the latter is approximately lined up with that of the conduction band in the injector. In the exemplary laser this corresponds to an applied voltage per period of about 0.3V and to a total voltage of about 7.5V. By way of example, the injector layer sequence of the QC of Table I is 3.6/1.7/3.3/2.0/3.0/2.3/2.6/2.7/2.2/3.1/1.9/3.4/1.6/3.7/1.4/4.0, where all thicknesses are in nm, and underlined thicknesses pertain to the QWs.

The 25 nm thick digitally graded region on the InP substrate serves as relaxation region. Its layer sequence is 0.5/4.5/1.0/4.0/1.5/3.5/2.0/3.0/2.5/2.5, with all thicknesses being in nm, and the underlined thicknesses being the QWs. The QWs have composition Ga$_{0.47}$In$_{0.53}$As, and barriers have composition Al$_{0.48}$In$_{0.52}$As.

An advantageous feature of QC lasers according to this invention is the generally high oscillator strength of the lasing transition, i.e., the direct radiative transition between states at the bottom of the upper active region miniband and states at the top of the lower active region miniband. The oscillator strength increases with wavevector $k_z$. The wavevector attains maximum value $\pi/d$ at the mini-Brillouin zone boundary of the active region superlattice. In particular, the oscillator strength strongly increases with decreasing barrier layer thickness. By way of example, in the above described QC laser the ratio of oscillator strength at $k_z=\pi/d$ and $k_z=0$ is about 60. In the above discussion, d is the superlattice period.

Figure 2:
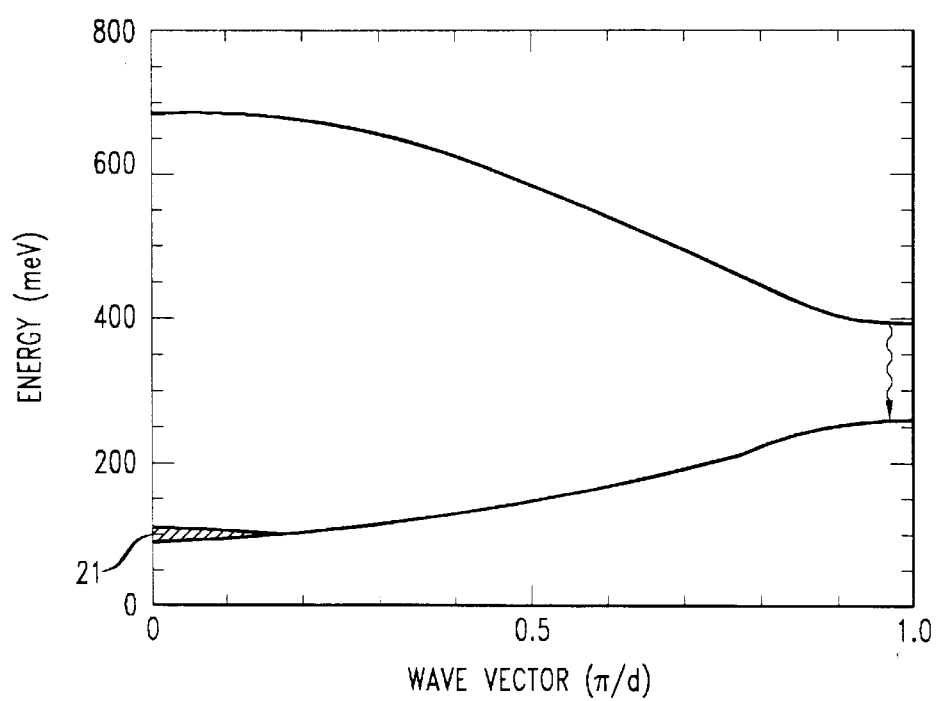
FIG. 2 shows the calculated dispersion of the lowest two minibands of the exemplary QC laser in the reduced Brillouin scheme.

FIG. 2 shows the calculated dispersion in the reduced Brillouin zone scheme of the lower and upper minibands of the superlattice active region of the exemplary QC laser. The wavevector $k_z$ perpendicular to the layers is in units of the value at the minizone boundary ($k_z=\pi/d$). The calculated widths of the lower and upper minibands are 146 and 300 meV, respectively. The wavy arrow indicates the lasing transition. The photon energy is calculated to be 159 meV, in good agreement with measurements. Shaded region 21 indicates the range of occupied electronic states in the lower miniband.

Measurements also confirm that the luminescence spectrum of the exemplary layer structure typically is dominated by optical transition at the zone boundary. This is generally true even for injection into the upper miniband well above the bottom of the miniband. This is attributed to the ultrafast intraminiband relaxation ($\leq 1$ ps) by emission of optical phonons, and to the large matrix element ($Z_{21}\sim 3.6$ nm) of the zone boundary optical transition.

QC lasers according to this invention generally exhibit the advantageous feature that population inversion is ensured by the fact that the lifetime $\tau_1$ of an electron at the top of the active region lower miniband is substantially negligible ($\tau_1\sim 0.1$ ps), as compared to the scattering time $\pi_{21}$ of the electrons in the upper state of the lasing transition ($\pi_{21}\sim 10$ ps). This large difference can be attributed to the much greater momentum transfer for the inter-miniband optical transition, compared to the intra-miniband transitions.

Carrier lifetime in the lower energy state is controlled by intraminiband phonon emission and is inherently short. For $\lambda$ in the range 3–15 $\mu$m it is generally much shorter than the interminiband scattering time. Thus, the population inversion condition is relatively insensitive to wavelength, simplifying the design of the laser.

In QC lasers according to the invention, injection of carriers into the upper miniband is by interminiband tunneling, as indicated in FIG. 1. Onset of strong injection into the upper miniband occurs when the applied voltage is such that the bottom of the upper miniband is approximately lined up with the bottom of the injector conduction band, exemplarily at about 0.3 V/repeat unit.

A wafer with the above-described layer structure was lithographically processed into mesa etched (10 $\mu$m–20 $\mu$m) wide ridge waveguides. The length of the optical cavity (1.9 mm) was defined by cleaving of the wafer. The cleaved uncoated facets provide the optical feedback in conventional manner. Six devices were tested and exhibited laser action with very similar spectra.

Figure 3:
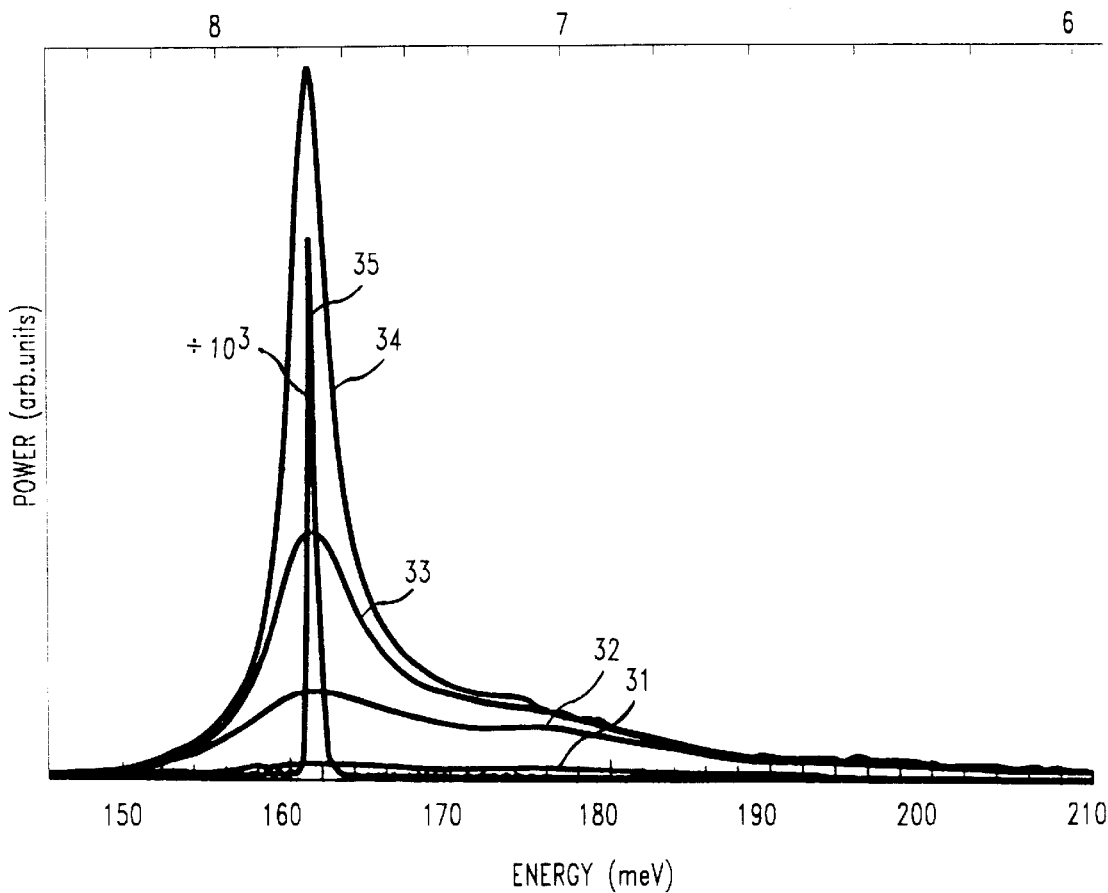
FIG. 3 shows curves of optical power vs. photon energy of an exemplary QC laser according to the invention.
Figure 4:
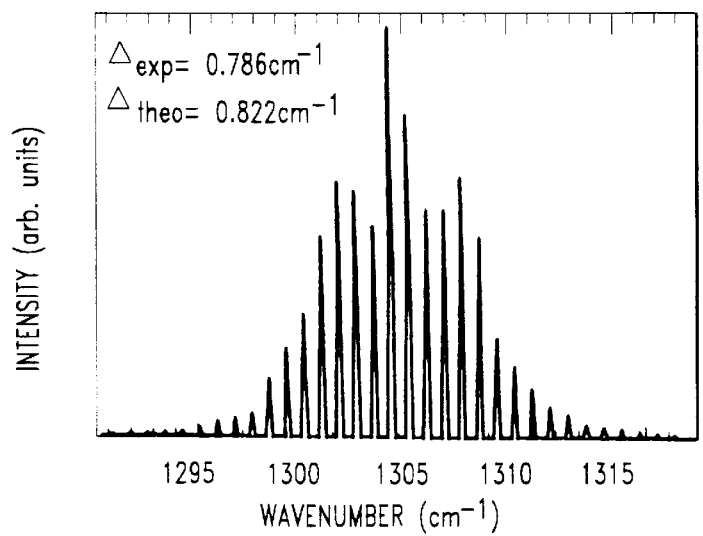
FIG. 4 shows the high resolution spectrum of the laser of FIG. 3.

The devices, soldered to a ceramic holder, were mounted in a Helitran® flow dewar. Current pulses (70 ns duration, 100 kHz repetition rate) were injected into a device and the emission spectrum was recorded with a Nicolet Fourier-transform IR spectrometer using a HgCdTe cooled detector. FIGS. 3 and 4 show exemplary results. Curves 31–34 of FIG. 3 show emission below threshold, at various bias conditions, namely, (1.48A, 7.5V), (1.58A, 7.6V), (1.69A, 7.67V), and (1.71A, 7.7V), respectively. Curve 35 of FIG. 3 shows the emission spectrum at 1.75A and 7.73V, and demonstrates laser action. Note that curve 35 is scaled down by $10^3$, compared to the sub-threshold curves. The laser photon energy of 161 meV was in excellent agreement with the calculated value of the active region minigap.

FIG. 4 shows the high-resolution spectrum of the device of FIG. 3, at 1.72A and 7.7V. The measured longitudinal mode separation ($\Delta_{exp}$) is in good agreement with the theoretical value $\Delta_{th}$.

Figure 5:
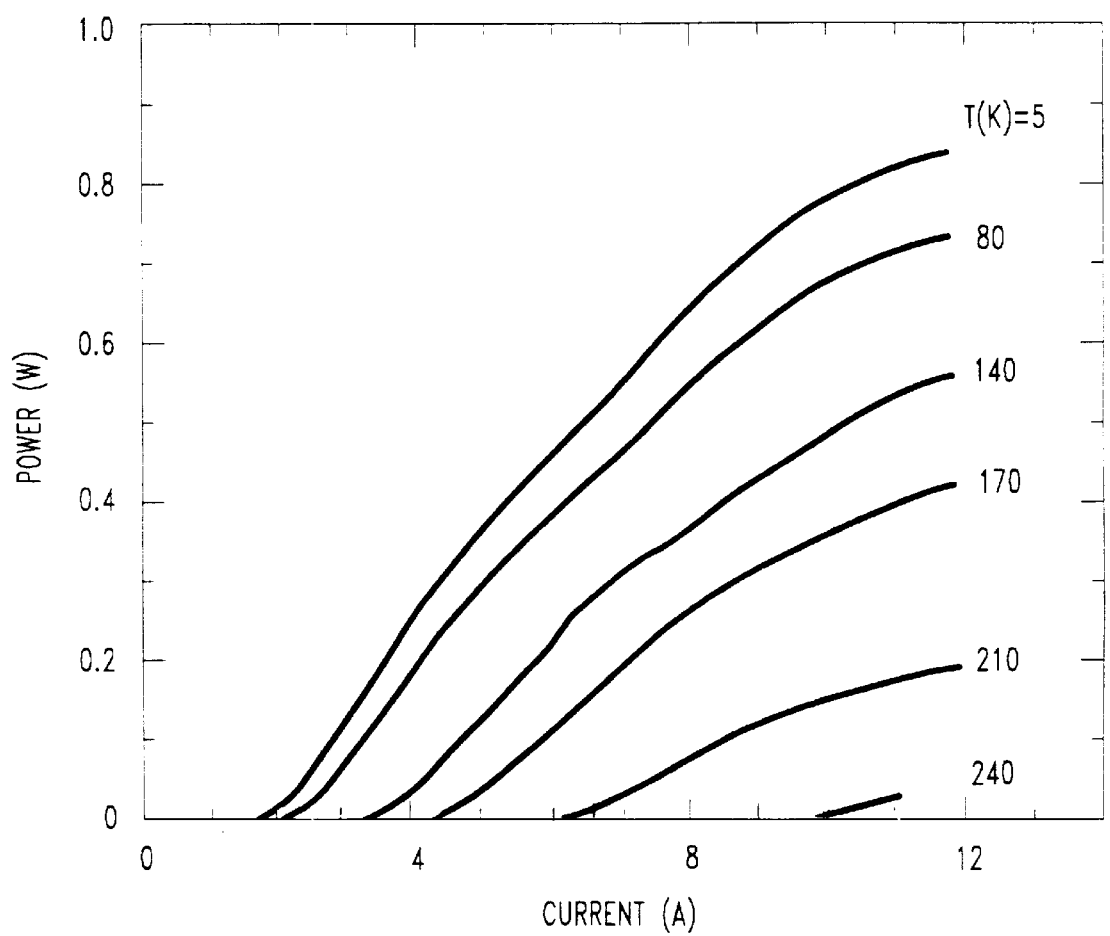
FIG. 5 shows data on power vs. current for an exemplary QC laser according to the invention.

FIG. 5 shows the measured peak optical power as a function of drive current, at various device temperatures, for an exemplary device as described above. The maximum operating temperature for the exemplary, non-optimized QC laser was 240K, with optical power at that temperature as high as 30 mW.

We also made a laser that emitted at 11 $\mu$m. The laser was made substantially as described, except that the layer thicknesses were changed in appropriate manner. The laser functioned as expected.

The invention claimed is:

1. An article comprising a quantum cascade laser comprising a first and a second cladding region, with a core region therebetween, and further comprising electrical contacts selected to facilitate flowing an electrical current through the laser, wherein the core region comprises a multiplicity of essentially identical multilayer semiconductor repeat units, each repeat unit comprising an active region and a carrier injector region, the active region having an upper and a lower energy state, with carrier transition from the upper to the lower energy state resulting in emission of a photon of wavelength $\lambda$;

CHARACTERIZED IN THAT a) the active region comprises a superlattice region having an upper and a lower miniband, with a minigap between the upper and lower minibands, with the upper energy state being in the upper miniband and the lower energy state being in the lower miniband; and b) the carrier injector region is selected to facilitate carrier transport from the lower miniband of a given repeat unit to the upper miniband of an adjacent downstream repeat unit.

2. Article according to claim 1, wherein the active region is selected such that $\lambda$ is in the wavelength range 3–15 $\mu$m.

3. Article according to claim 1, wherein the carriers are electrons.

4. Article according to claim 1, wherein the core region comprises 10 or more repeat units.

5. Article according to claim 3, wherein at least the active regions comprise doped semiconductor material.

6. Article according to claim 1, wherein the core region has an effective refractive index that is larger than the effective refractive indices of the first and second cladding regions.

7. Article according to claim 6, wherein at least one of said first and second cladding regions comprises a binary semiconductor material.

8. Article according to claim 7, wherein said binary semiconductor material is doped InP, said doped InP serving as a substrate for the core region.

* * * * *